United States Patent [19]

McMonagle

[11] Patent Number: 4,525,247

[45] Date of Patent: Jun. 25, 1985

[54] MICROWAVE CIRCUIT BOARDS AND METHOD OF MANUFACTURE THEREOF

[75] Inventor: Rodger P. McMonagle, Tempe, Ariz.

[73] Assignee: Rogers Corporation, Rogers, Conn.

[21] Appl. No.: 397,546

[22] Filed: Jul. 12, 1982

[51] Int. Cl.³ .................... C25D 11/08; H05K 1/09
[52] U.S. Cl. .................................. 204/24; 204/38.3;
  204/38.5; 204/42; 339/17 B; 427/97; 427/98
[58] Field of Search ............... 204/38 R, 38 A, 38 S,
  204/42, 58, 15, 24, 56 R; 427/96, 97, 98; 339/17
  A, 17 B, 17 T; 29/846, 852; 156/901

[56] References Cited

U.S. PATENT DOCUMENTS 4,293,377 10/1981 Miyajima ..................... 156/656
4,389,278 6/1983 Kai ............................. 156/630

Primary Examiner—G. L. Kaplan
Assistant Examiner—W. T. Leader
Attorney, Agent, or Firm—Fishman & Dionne

[57] ABSTRACT

Circuit boards, useful in microwave frequency applications, are formed from a laminate consisting initially of an insulator sandwiched between a copper foil and an aluminum plate. The boards are provided with through-hole connections by means of a procedure which includes drilling through the board to form through-holes, anodizing all exposed surfaces of the aluminum, electroplating copper over all anodized aluminum surfaces, sodium or plasma etching to alter the surface of the walls of the holes in the insulator to allow them to be "wet", and electroless copper plating the entire board to form a continuous upper coating over the copper foil, the copper plate and the walls of the through-holes.

30 Claims, 6 Drawing Figures

MICROWAVE CIRCUIT BOARDS AND METHOD OF MANUFACTURE THEREOF

BACKGROUND OF THE INVENTION (1) Field of the Invention

The present invention relates to circuit boards which are suitable for use at microwave frequencies. More specifically, this invention is directed to circuit boards and a method of forming circuit boards having through-hole connections in a laminate which includes a plastic film sandwiched between copper and aluminum layers.

(2) Description of the Prior Art

The present invention has particular utility in the formation of circuit boards for transmission of electrical signals at microwave frequencies. Circuit boards for use at microwave frequencies often have a comparatively thick aluminum plate or layer which, among other uses, functions as a heat sink. A layer of plastic material, selected for its dielectric and mechanical properties, will be adhesively bonded to one surface of the aluminum layer and the circuit board laminate will also have a layer of copper foil bonded to the exposed surface of the dielectric film, i.e., the plastic layer. The dielectric film may, for example, be comprised of polytetrafluoroethylene (PTFE) or fiber reinforced PTFE. This laminate of dielectric material sandwiched between a relatively thick lower layer of aluminum and a relatively thin upper layer of copper foil may be viewed as a preliminary, starter, or intermediate circuit board structure.

In such circuit boards it is necessary to establish electrical connections between portions of the circuit, which will be formed on or in the copper foil layer, and the aluminum plate which forms part of the ground plane. These connections are desirably implemented via through-holes in the laminate. The establishment of such through-hole connections in a reliable and cost-effective manner is a problem of long standing in the art. Most desirably, the through-hole connections will be effected by electroless plating of copper. However, it is not possible to produce, simply by electroless plating, a conductive path between spaced copper and aluminum elements. It is, in fact, well known in the art that plating upon aluminum requires extraordinary treatments to obtain the requisite adhesion.

There are presently two principal techniques for plating upon aluminum. These two techniques are the zincating process, wherein a thin layer of zinc is deposited upon the aluminum base and other metals are subsequently deposited over the zinc, and the anodizing process where a porous anodic coating is produced and a metal subsequently plated over the coating. Because of its comparative ease of implementation and relatively low cost, the zincating process is by far the more widely use technique. However, this technique has the disadvantages that it is very sensitive to the condition of the surface of the aluminum thus requiring time consuming pre-zincating cleaning and etching treatments. Further, it is generally considered inadvisable to use zinc coated aluminum members in electrical circuit applications since the zinc will melt during soldering, mix with the solder and produce high resistance or otherwise defective connections. The foregoing is also true of cadmium which is sometimes substituted for zinc.

Anodizing processes have not been employed in the production of microwave circuit boards since it has been universally believed that the copper would prevent an anodic coating from forming on the aluminum surface or the copper would be chemically attacked and thereby rendered unfit for use.

Accordingly, when faced in the prior art with the necessity of establishing a through-hole connection between the aluminum and copper layers of a microwave circuit board laminate, and being unable to employ a zincating process, resort has been had to the unreliable technique of trying to deposit copper or nickel either directly on the aluminum or on aluminum which has previously been given a chromate conversion coating. As is well known, such methods produce poor quality plated metal coatings that exhibit low bond strength to the aluminum base metal. Thus, exposure of these poor quality coatings to elevated temperatures, for example soaking for one hour at 250° F. or immersion in molten 60/40 tin/lead solder, will cause the coating to blister.

SUMMARY OF THE INVENTION

The present invention overcomes the above-discussed and other deficiences and disadvantages of the prior art by providing a novel microwave circuit board laminate with plated through-holes and by providing a novel method of manufacturing circuit boards from such laminates.

The article and process of the present invention involves microwave circuit boards with conductive through-holes. The invention starts with a laminate structure of a sheet of dielectric material with a thin layer of copper on one surface and a thicker layer of aluminum on the other surface. Through-holes are drilled through the laminate in a predetermined pattern. All exposed aluminum surfaces (the layer of aluminum and the walls of the through-holes passing through the aluminum layer) are anodized by a carefully controlled process to define a porous aluminum oxide coating. During the anodizing process the thin copper layer on the dielectric is electrically isolated from the aluminum. Next, a layer of conductive material is electroplated over all of the aluminum oxide. Next, the structure is subjected to a sodium or plasma etch to treat the walls of the holes in the dielectric to allow them to be "wet". Next, the entire structure is electroless plated to form a complete coating of metal on all exposed surfaces of the structure, including all exposed electroplated metal areas, the original thin copper layer and the entire through-hole surfaces. Thereafter a microwave circuit pattern will be defined on the surface which originally had the thin layer of copper, with the plated through-holes then forming conductive contacts between the circuit pattern and the other copper surface (over the aluminum) which is the ground plane.

Figure 1:
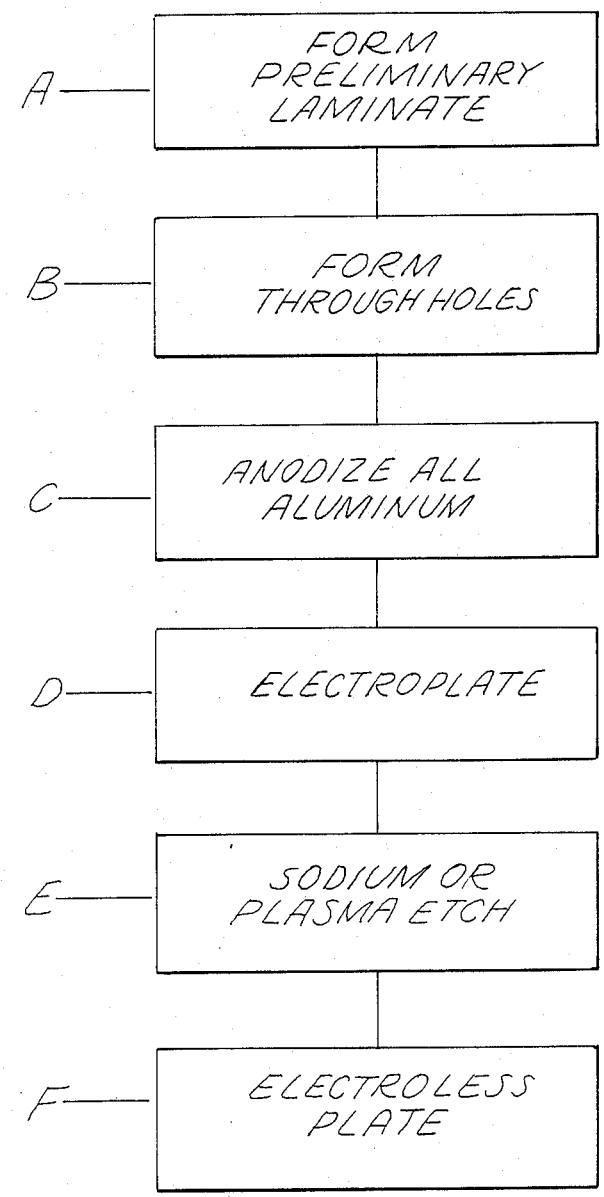
FIG. 1 is a flow diagram of the principal steps of the process of the present invention.

It is to be understood in the drawings of FIGS. 2A–2D that the showings of various metal coatings are shown for illustration purposes only and are not to scale or proportion.

DESCRIPTION OF THE PREFERRED EMBODIMENT

Figure 2:
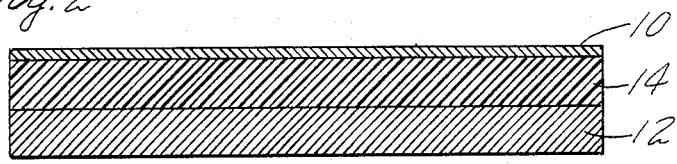
FIGS. 2A–2E show the circuit board at various process steps.
Figure 2:
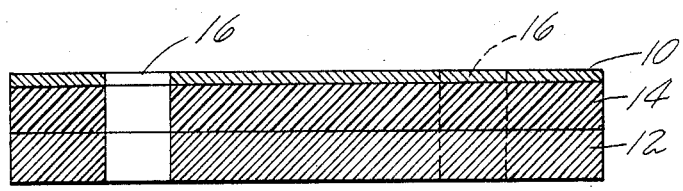
Figure 2:
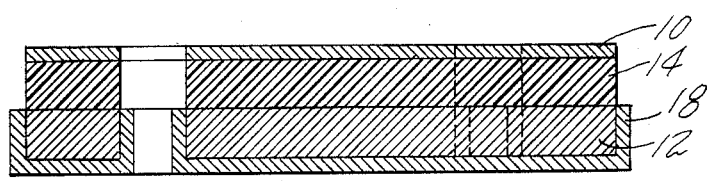
Figure 2:
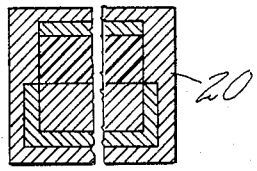
Figure 2:
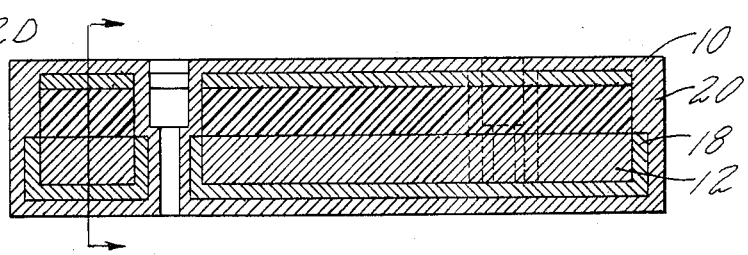

In accordance with the preferred embodiment, microwave circuit boards are fabricated from a preliminary or intermediate laminate consisting originally of a copper foil 10 and an aluminum plate 12 adhesively bonded to opposite surfaces of a sheet of fiber reinforced polytetrafluoroethylene 14 (see FIG. 2A). The laminate may, for example, comprise "RT/duroid" 5870 or 5880 available from Rogers Corporation, Rogers, Connecticut. In one reduction to practice the copper foil was 0.0014 inches thick, the sheet of insulating material was 0.060 inches thick and the aluminum layer was 0.065 inches thick and was comprised of 6061-T6 type aluminum.

After formation of the preliminary laminate (step A), the next step (step B) in the fabrication of a microwave circuit board comprises the drilling of through-holes 16 of the required dimensions and at the desired points through the laminate (see FIG. 2B). The drilled holes are then deburred if necessary. The laminate is then cleaned. Cleaning may expeditiously be accomplished employing a cleaning solution which is neutral with respect to both the aluminum and copper. The cleaning step is for the purpose of degreasing the laminate and removing ordinary shop soil and fingerprints.

The cleaned laminate is then immersed in an aqueous anodizing solution which, in one reduction to practice of the invention, consisted of thirty (30%) percent by volume of eighty-five (85%) percent $H_3PO_4$. All exposed aluminum surfaces (i.e., all originally exposed surfaces of aluminum and the interior walls of the portions of the through-holes passing through the aluminum layer) are anodized (Step C) by means of a carefully controlled process wherein electrical contact is made to the aluminum surface through the use of a reusable titanium clip. Care is taken to insure that the clip is electrically insulated from the copper side of the laminate. Failure to observe this precaution will result in the copper being etched from the laminate and no anodic coating formed on the aluminum. During the anodizing process the temperature of the solution is maintained within the range of 105° to 118° F. and preferrably at 110° F. In one reduction to practice, where the temperature of the solution was 110° F., the anode current density was 25 amp/ft$^2$ and the anodizing was allowed to continue for five minutes. During anodization the solution was moderately agitated so as to insure that oxygen bubbles which form on the surface of the aluminum during anodization do not prevent complete anodization, especially on the walls of the drilled holes. The oxide coating formed in the practice of this invention will have a coating weight in the range of 0.1 to 2.0 milligrams/in$^2$.

Subsequent to the anodizing step the substrate is rinsed, typically by washing in clean water.

The next step in the process (Step D) comprises the electroplating of a copper coating 18, or some other electrically conductive metal such as nickel, over the aluminum oxide coating formed during the anodizing step (see FIG. 2C). In the case of copper electroplating, the substrate was immersed in an acid $CuSO_4$ solution until the aluminum oxide was covered with an adherent copper film. Due to the porosity of the aluminum oxide coating produced through careful control of the anodizing step, the copper electroplated over the aluminum oxide will penetrate the pores and, it is believed, will also plate on the aluminum base metal. In any event, the plated copper will strongly adhere to the oxide coating and will be in electrical contact with the base aluminum whereby an electrical connection to the base metal may be established by making electrical contact with the copper plate. In one reduction to practice, the copper was placed from a $CuSO_4$—$H_2SO_4$ solution obtained from Lea-Ronal Inc., Freeport, New York and sold commercially under the name Copper Gleam PCM. In another reduction to practice, a nickel plate was substituted for the copper and a $(NH_2SO_3H)_2Ni$ solution was utilized. The plated metal serves as the ground plane in the resulting microwave circuit board.

It has been found particularly important, in order to obtain a coating which will reliably establish electrical contact with the aluminum base metal, that the DC power should be on when the laminate is inserted in the plating tank. Typical parameters of a copper plating step are as follows:

solution temperature = 70° to 90° F.
cathode current = 20 to 40 amps/ft$^2$
anode-cathode area ratio = 1:1 to 2:1
time = 10 to 20 min.

Solution agitated with clean air (bubbling) The thickness of the plating will be in the range of 0.0002 to 0.0004 inches for both copper and nickel.

After the electroplating step, the structure is subjected to a sodium or plasma etching (Step E) to alter all exposed surfaces of the dielectric, especially the walls of the through-holes. This treatment allows the walls of the holes to be wetted, i.e., accept or receive a water based material.

Subsequent to the etch treatment, the laminate is washed with a catalyzing (paladium salt) bath. Then, the structure is electroless copper (or nickel) plated to form a continuous copper (or nickel) coating 20 over the original copper foil, the copper plate (on the original aluminum) and the walls of the through-holes. (See FIG. 2D and FIG. 2E, which is a segmented section taken along line E-E of FIG. 2D) The copper (or nickel) plating on the walls of the through-holes establish conductive paths through the drilled holes between the thin copper foil and the copper plating and, via the plated copper to the aluminum base metal. The microwave circuit board structure is then completed and ready for formation or definition of a circuit pattern thereon.

After this circuit board structure has been completed, one or more microwave circuit patterns may be formed on the surface carrying the original thin copper foil. Portions of the circuit pattern will, as desired, be connected to the ground plane by the now conductively coated through-holes.

As will be obvious to those skilled in the art, it is within the contemplation of the present invention to apply additional metal deposits such as, for example, copper-solder or copper-nickel-gold for the purpose of enhancing electrical properties and/or solderability of the copper layer or to obtain metal layers which are resistant to the action of chemical etchants used to define circuit elements.

While a preferred embodiment has been described, various modifications and substitutions may be made thereto without departing from the spirit and scope of the invention. Accordingly, it will be understood that the present invention has been described by way of illustration and not limitation.

What is claimed is:

1. A method of preparing a circuit board from a laminate of dielectric material sandwiched between layers of copper and aluminum comprising the steps of:
   forming at least one through-hole in the laminate;
   anodizing the exposed areas of the aluminum layer in $H_3PO_4$ while electrically isolating the aluminum from the copper;
   electroplating a conductive metal over the anodic coating on the aluminum;
   etching exposed areas of the dielectric material; and
   electroless plating a conductive metal coating over all exposed surfaces of the laminate.

2. The method of claim 1 wherein the step of forming through-holes further comprise:
   forming a pattern of holes through the aluminum-dielectric-copper laminate whereby the subsequent steps of anodizing, electroplating, etching and electroless plating will establish conductive paths through the board via plated through-holes.

3. The method of claim 1 wherein the step of anodizing comprises:
   establishing electrical contact to the aluminum layer by means of a titanium contact electrically isolated from the copper layer.

4. The method of claim 3 wherein the step of electroplating comprises:
   immersing the anodized laminate in a plating tank containing $CuSO_4$ subsequent to establishing electrical contact between a current source and the anode and cathode of the plating apparatus.

5. The method of claim 1 wherein the step of anodizing includes:
   maintaining the temperature of the $H_3PO_4$ in the range of 105° to 118° F.

6. The method of claim 3 wherein the step of anodizing includes:
   maintaining the temperature of the $H_3PO_4$ in the range of 105° to 118° F.

7. The method of claim 4 wherein the step of anodizing includes:
   maintaining the temperature of the $H_3PO_4$ in the range of 105° to 118° F.

8. The method of claim 1 wherein the step of anodizing is continued until an oxide coating having a weight in the range of 0.1 to 2.0 milligrams per square inch is formed.

9. The method of claim 7 wherein the step of anodizing is continued until an oxide coating having a weight in the range of 0.1 to 2.0 milligrams per square inch is formed.

10. The method of claim 1 wherein the step of electroplating includes electroplating copper or nickel under the following conditions:
    solution temperature = 70° to 90° F.
    cathode current = 20 to 40 amps/ft$^2$
    anode-cathode area ratio = 1:1 to 2:1
    time = 10 to 20 min.
    solution agitated with clean air.

11. The method of claim 1 wherein the step of electroplating includes:
    immersing the laminate in an electroplating tank for which the power is on prior to immersion.

12. The method of claim 11 wherein the step of electroplating includes electroplating copper or nickel under the following conditions:
    solution temperature = 70° to 90° F.
    cathode current = 20 to 40 amps/ft$^2$
    anode-cathode area ratio = 1:1 to 2:1
    time = 10 to 20 min.
    solution agitated with clean air.

13. The method of claim 1 including the steps of:
    cleaning the laminate after formation of said through-hole.

14. The method of claim 1 including the steps of:
    cleaning the laminate with a solution neutral to both aluminum and copper after formation of said through-hole.

15. The method of claim 1 including the steps of:
    rinsing the substrate after the step of anodizing.

16. A method of preparing a circuit board from a laminate of dielectric material sandwiched between layers of copper and aluminum comprising the steps of:
    forming at least one through-hole in the laminate;
    anodizing the exposed areas of the aluminum layer in an anodizing solution while electrically isolating the aluminum from the copper;
    electroplating a conductive metal over the anodic coating on the aluminum;
    etching exposed areas of the dielectric material; and
    electroless plating a conductive metal coating over all exposed surfaces of the laminate.

17. The method of claim 16 wherein the step of forming through-holes further comprise:
    forming a pattern of holes through the aluminum-dielectric-copper laminate whereby the subsequent steps of anodizing, electroplating, etching and electroless plating will establish conductive paths through the board via plated through-holes.

18. The method of claim 16 wherein the step of anodizing comprises:
    establishing electrical contact to the aluminum layer by means of a titanium contact electrically isolated from the copper layer.

19. The method of claim 18 wherein the step of electroplating comprises:
    immersing the anodized laminate in a plating tank containing $CuSO_4$ subsequent to establishing electrical contact between a current source and the anode and cathode of the plating apparatus.

20. The method of claim 16 wherein the step of anodizing includes:
    maintaining the temperature of the $H_3PO_4$ in the range of 105° to 118° F.

21. The method of claim 18 wherein the step of anodizing includes:
    maintaining the temperature of the $H_3PO_4$ in the range of 105° to 118° F.

22. The method of claim 19 wherein the step of anodizing includes:
    maintaining the temperature of the $H_3PO_4$ in the range of 105° to 118° F.

23. The method of claim 16 wherein the step of anodizing is continued until an oxide coating having a weight in the range of 0.1 to 2.0 milligrams per square inch is formed.

24. The method of claim 22 wherein the step of anodizing is continued until an oxide coating having a weight in the range of 0.1 to 2.0 milligrams per square inch is formed.

25. The method of claim 16 wherein the step of electroplating includes electroplating copper or nickel under the following conditions:
    solution temperature = 70° to 90° F.
    cathode current = 20 to 40 amps/ft$^2$
    anode-cathode area ratio = 1:1 to 2:1
    time = 10 to 20 min.

solution agitated with clean air.

26. The method of claim 16 wherein the step of electroplating includes:
   immersing the laminate in an electroplating tank for which the power is on prior to immersion.

27. The method of claim 26 wherein the step of electroplating includes electroplating copper or nickel under the following conditions:
   solution temperature = 70° to 90° F.
   cathode current = 20 to 40 amps/ft$^2$
   anode-cathode area ratio = 1:1 to 2:1
   time = 10 to 20 min.
   solution agitated with clean air.

28. The method of claim 16 including the steps of:
   cleaning the laminate after formation of said through-hole.

29. The method of claim 16 including the step of:
   cleaning the laminate with a solution neutral to both aluminum and copper after formation of said through-hole.

30. The method of claim 16 including the step of:
   rinsing the substrate after the step of anodizing.

* * * * *